United States Patent
Lin et al.

(10) Patent No.: US 11,715,518 B2
(45) Date of Patent: Aug. 1, 2023

(54) DYNAMIC INHIBIT VOLTAGE TO REDUCE WRITE POWER FOR RANDOM-ACCESS MEMORY

(71) Applicant: Taiwan Semiconductor Manufacturing Company, Ltd., Hsinchu (TW)

(72) Inventors: Zheng-Jun Lin, Taichung (TW); Chin-I Su, Hsinchu (TW); Pei-Ling Tseng, Miaoli (TW); Chung-Cheng Chou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 30 days.

(21) Appl. No.: 17/470,849

(22) Filed: Sep. 9, 2021

(65) Prior Publication Data

US 2022/0254412 A1    Aug. 11, 2022

Related U.S. Application Data

(60) Provisional application No. 63/148,419, filed on Feb. 11, 2021.

(51) Int. Cl.
*G11C 13/00* (2006.01)

(52) U.S. Cl.
CPC ........ *G11C 13/0028* (2013.01); *G11C 13/003* (2013.01); *G11C 13/0026* (2013.01); *G11C 13/0038* (2013.01); *G11C 13/0069* (2013.01); *G11C 2213/79* (2013.01)

(58) Field of Classification Search
CPC ............ G11C 13/0028; G11C 13/0026; G11C 13/003; G11C 13/0038; G11C 13/0069; G11C 2213/79; G11C 5/147; G11C 8/08; G11C 2213/82; G11C 13/0009
See application file for complete search history.

(56) References Cited

U.S. PATENT DOCUMENTS

| | | | | |
|---|---|---|---|---|
| 10,796,741 | B1* | 10/2020 | Williams | G11C 13/0026 |
| 11,328,784 | B2* | 5/2022 | Sanjeevarao | G11C 13/0069 |
| 2020/0020397 | A1* | 1/2020 | Lai | G11C 13/003 |
| 2022/0246209 | A1* | 8/2022 | Lee | G11C 13/003 |
| 2022/0336016 | A1* | 10/2022 | Chou | G11C 13/0069 |

* cited by examiner

*Primary Examiner* — Khamdan N. Alrobaie
(74) *Attorney, Agent, or Firm* — Foley & Lardner LLP

(57) ABSTRACT

In some aspects of the present disclosure, a memory device is disclosed. In some aspects, the memory device includes a first voltage regulator to receive a word line voltage provided to a memory array; a resistor network coupled to the first voltage regulator to provide an inhibit voltage to the memory array, wherein the resistor network comprises a plurality of resistors and wherein each of the resistors are coupled in series to an adjacent one of the plurality of resistors; and a switch network comprising a plurality of switches, wherein each of the switches are coupled to a corresponding one of the plurality of resistors and to the memory array via a second voltage regulator.

9 Claims, 11 Drawing Sheets

DYNAMIC INHIBIT VOLTAGE TO REDUCE WRITE POWER FOR RANDOM-ACCESS MEMORY

CROSS-REFERENCE TO RELATED APPLICATION

This application is related to and claims priority under 35 U.S. § 119(e) the U.S. Provisional Patent Application No. 63/148,419, filed Feb. 11, 2021, titled "A NOVEL SYSTEM AND METHOD FOR GENERATING A DYNAMIC INHIBIT VOLTAGE," the entire contents of which are incorporated herein by reference for all purposes.

BACKGROUND

Resistive random-access memory (RRAM) is a type of non-volatile (NV) random-access memory (RAM) that works by changing a resistance across a material. The material can include a dielectric solid-state material, but a broad range of materials can be used for RRAM. The material can be referred to as a memristor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
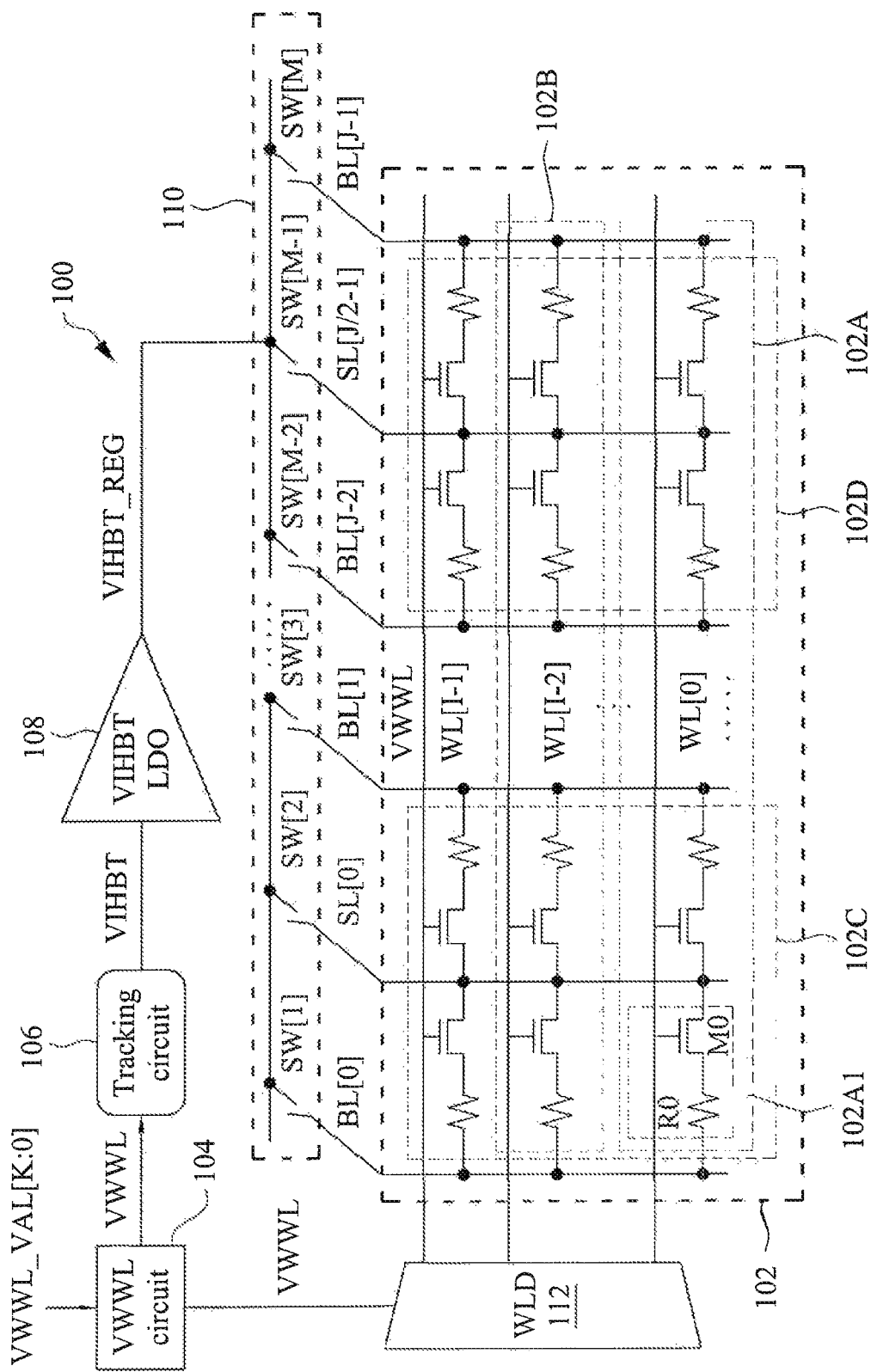
FIG. 1 illustrates a block diagram of a memory system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a memory device, system, and method that provides a dynamic inhibit voltage to unselected memory cells of a memory array. In some embodiments, multiple, different word line (WL) voltage levels is used to support write operation of Resistive Random Access Memory (RRAM) memory cells. For example, a memory controller is not able to write to some RRAM memory cells by applying a first WL signal with a default WL voltage level, for example, due to process variation or defects among the RRAM memory cells. Thus, the memory controller applies a second WL signal with a second, higher WL voltage level may be used to successfully write to the RRAM memory cells that were not successfully written to by applying the first WL signal with the default WL voltage level. However, higher WL voltage levels can increase the gate stress and gate leakage. On the other hand, providing a higher, fixed inhibit voltage across multiple WL voltage levels can induce higher array (e.g., drain and source) leakage, which may result in higher write power, and can even cause the array leakage to dominate the write power. Disclosed herein are embodiments of a memory device, system, and method for providing a dynamic inhibit voltage that changes according to different WL levels. Further disclosed herein are embodiments for tracking leakage over process, voltage supply voltage, and temperature (PVT). Further disclosed herein are embodiments for operating charge sharing between adjacent bit lines and select lines before the adjacent bit lines and select lines are pulled up to the inhibit voltage.

Advantageously, embodiments of the disclosed memory device, system, and method can achieve several benefits. In some embodiments, the disclosed memory device, system, and method can reduce array leakage of the unselected memory cells and write power while protecting the select transistors of the unselected memory cells from gate stress. Moreover, some embodiments of the disclosed memory device, system, and method can adjust the inhibit voltage to compensate for PVT effects. In addition, some embodiments of the disclosed memory device, system, and method can avoid or reduce dynamic power consumption. Some embodiments of the disclosed memory device, system, and method can be used for RRAM memory cells, but other types of memory cells are within the scope of the disclosure.

FIG. 1 illustrates a block diagram of a memory system 100, in accordance with some embodiments. The memory system 100 includes a memory array 102. The memory array 102 includes a plurality of memory cells (e.g., the memory cell 102A1) that can be arranged in a column-row configuration. For example, the memory array 102 includes a plurality of memory cells in which each subset of a first dimension (e.g., column, bank), such as each of subsets 102C and 102D, has a first bit line (BL), a select line (SL), and a second BL; and each subset of a second dimension (e.g., row), such as each of subsets 102A and 102B, has a word line (WL). The BLs and SL of each column are respectively coupled to a plurality of memory cells that are disposed in that column, and each pair of memory cells in that column is arranged on a different row and coupled to a respective (different) WL. That is, each memory cell of the memory array 120 is coupled to a BL of a column of memory array 120, a SL of the column of the memory array 120, and a WL of a row of the memory array 120. In some embodiments, the BLs and SLs are arranged in parallel vertically and the WLs are arranged in parallel horizontally (i.e., perpendicular to the BLs and SLs). In some embodiments, two memory cells of a same row and a same column have different BLs but a same SL.

Referring still to FIG. 1, the memory array 102 includes I×J memory cells having I WLs, J BLs, and J/2 SLs, wherein I and J are integer numbers. In some embodiments, the pairs of memory cells arranged along a first column includes a first memory cell coupled to a respective BL of the first column, "BL[0]" and a second memory cell coupled to a respective BL of the first column, "BL[1]." The pairs of memory cells arranged along a first column may be coupled to a respective SL of the first column, "SL[0]," and the pairs of memory cells arranged along a first column may each coupled to a WL of the respective row: WL[0] . . . WL[I−2], and WL[I−1]. Each of the other columns may be arranged similarly. Each of the selected columns (e.g., selected memory cells, selected portion of the memory array 102) may receive, through its corresponding first BL, SL, and second BL, a bit line voltage (e.g., VCH), a reference voltage (e.g., ground, 0 V), and the reference voltage (e.g., 0 V), respectively; and each of the unselected columns (e.g., unselected memory cells, unselected portion of the memory array 102) may receive, through each of its corresponding first BL, SL, and second BL, an inhibit voltage (VIHBT). In some embodiments, the subset 102C is a selected column and the subset 102D is an unselected column. A selected row may receive, through its corresponding WL, a word line voltage (e.g., VWWL), and each of the unselected rows may receive, through its corresponding WL, the reference voltage. In some embodiments, the subset 102B is a selected row and the subset 102A is an unselected row. In some embodiments, a memory cell is programmed (e.g., or read from) if it receives both the first voltage VCH through its corresponding BL and the word line voltage VWWL through its corresponding WL.

Each memory cell of the memory array 120 is configured to store/present a data bit, or a datum. Such a data bit may be repeatedly read out from (i.e., a read operation) or written to (i.e., a write operation) each bit cell with a respective logic state (i.e., either a logical 1 or a logical 0). Although the illustrated embodiment of FIG. 1 includes I×J memory cells in the memory array 120, any desired number of memory cells may be included in the memory array 120 while remaining within the scope of the present disclosure. As such, the number of columns and rows (and corresponding BLs/SLs and WLs) can be adjusted in accordance with the number of memory cells in the memory array 120.

In some embodiments, the memory array 120 includes a variety of volatile and/or non-volatile memories. For example, in some embodiments, the memory array 120 includes Resistive Random Access Memory (RRAM) cores or memory cells. For example, the memory cell 102A1 includes a resistor RO and a select transistor MO coupled to the resistor RO. Responsive to applying a voltage (e.g., VCH) across the resistor RO, the resistor RO may change from a first state (e.g., a first resistance) to a second state (e.g., a second resistance). In other embodiments, the memory array 120 includes NAND flash memory cores, NOR flash memory cores, SRAM cores, Dynamic Random Access Memory (DRAM) cores, Magnetoresistive Random Access Memory (MRAM) cores, Phase Change Memory (PCM) cores, 3D XPoint memory cores, ferroelectric random-access memory (FeRAM) cores, and other types of memory cores that are suitable for use within the memory array.

In some embodiments, the memory system 100 includes a voltage write word line (VWWL) circuit 104. The VWWL circuit 104 is configured to convert a digital VWWL signal (e.g., bits, word) (VWWL_VAL[K:0]) received at its input to an analog VWWL signal (e.g., voltage) at its one or more outputs, wherein K is an integer number. In some embodiments, the VWWL circuit 104 is implemented as a digital circuit (e.g., with logic gates). In some embodiments, the VWWL circuit 104 includes a mapping structure (e.g., a lookup table or LUT). The mapping structure can have a number of rows, wherein each row includes a column for the digital VWWL bits and a column for the corresponding VWWL voltage. The VWWL circuit 104 can be configured to map the digital VWWL bits to the corresponding VWWL voltage based on the mapping structure. An example of the LUT of the VWWL circuit 104 is shown below. However, any of various mapping structures are within the scope of the present disclosure. The mapping structure can be implemented with logic gates. The mapping structure can implement an algorithm embodied by the equation:

$$VWWL = m*VWWL\_VAL + b, \quad (1)$$

wherein m is the slope (e.g., the slope is a change in VWWL divided by a change in VWWL_VAL) and b is a value of VWWL when VWWL_VAL=0.

The example LUT shown below implements the equation:

$$VWWL = 0.1*VWWL\_VAL + 1.5. \quad (2)$$

| VWWL_VAL[K:0] | VWWL value (V) |
| --- | --- |
| 0000 | 1.5 |
| 0001 | 1.6 |
| 0010 | 1.7 |
| 0011 | 1.8 |
| 0100 | 1.9 |
| 0101 | 2.0 |
| 0110 | 2.1 |
| 0111 | 2.2 |
| 1000 | 2.3 |
| 1001 | 2.4 |

The memory system 100 includes a tracking circuit 106. In some embodiments, the tracking circuit 106 is coupled to the VWWL circuit 104. In some embodiments, the tracking circuit 106 directly receives the digital VWWL bits, while in other embodiments, the tracking circuit 106 receives the analog VWWL voltage. The tracking circuit 106 is configured to receive the VWWL (e.g., digital or analog) at its input and provide an inhibit voltage (VIHBT) at its output. The VIHBT may be at least based on (e.g., difference of fixed delta or proportional to, as embodied by Eqn. (3)) the VWWL. In some embodiments, the tracking circuit 106 is implemented as a digital circuit, an analog circuit, or a mixed-signal circuit. FIGS. 2-8 provide further details about implementing the tracking circuit 106. Advantageously, the tracking circuit 106 reduces leakage and associated power consumption while simultaneously protecting select transistors from an excessive gate stress voltage (e.g., greater than 1.5 V, but any of other various values are within the scope of the present disclosure).

In some embodiments, the tracking circuit 106 includes a second mapping structure. The second mapping structure can have a number of rows, wherein each row includes a column for the digital VWWL bits and a column for the corresponding analog VWWL voltage. The tracking circuit 106 can be configured to map the digital VWWL bits to the corresponding VIHBT voltage based on the second mapping structure. An example of the second mapping structure (e.g., a second LUT) of the VWWL circuit 104 is shown below. However, any of various mapping structures are within the scope of the present disclosure. The second mapping structure can be implemented with logic gates. The second mapping structure can implement an algorithm embodied by the equation:

$$VIHBT = m*VWWL\_VAL + b. \quad (3)$$

The example LUT shown below implements the equation:

$$VIHBT = 0.1*VWWL\_VAL + 0.2. \quad (4)$$

| VWWL_VAL[K:0] | VIHBT value (V) |
|---|---|
| 0000 | 0.2 |
| 0001 | 0.3 |
| 0010 | 0.4 |
| 0011 | 0.5 |
| 0100 | 0.6 |
| 0101 | 0.7 |
| 0110 | 0.8 |
| 0111 | 0.9 |
| 1000 | 1.0 |
| 1001 | 1.1 |

In some embodiments, the VWWL circuit 104 and the tracking circuit 106 are combined into one circuit. The combined circuit can receive the VWWL digital value at its input and provide both the analog VWWL signal and the analog VIHBT signal at its output.

The memory system 100 includes a VIHBT voltage regulator (e.g., low-dropout regulator or LDO regulator) 108. The VIHBT voltage regulator 108 can receive the VIHBT voltage at its input, regulate the VIHBT voltage, and provide a regulated voltage (VIHBT_REG voltage) at its output. For example, the VIHBT voltage regulator 108 determines a first difference between VIHBT_REG voltage and a regulation reference voltage VREF. Based on the first difference between the VIHBT_REG and the VREF voltage, a second difference between the VIHBT voltage and the VIHBT_REG voltage is updated. For example, in response to the first difference increasing, the second difference is reduced, and in response to the first difference decreasing, the second difference is increased. In some embodiments, the VIHBT voltage regulator includes an amplifier connected in feedback and coupled to a transistor in the feedback path, although any of other implementations are within the scope of the disclosure.

The memory system 100 includes a switch network 110. The switch network 110 includes a number of switches SW[1]-SW[M], wherein M is an integer number. Each of the switches of the switch network 110 can include a first terminal coupled to the VIHBT voltage regulator 108, a second terminal coupled to a corresponding BL or SL and a third terminal to receive a control signal. In some embodiments, responsive to receiving, at the third terminal, a first voltage corresponding to a first logic state, the switch electrically may decouple the VIHBT voltage regulator 108 from the corresponding column of memory cells, and responsive to receiving a second voltage corresponding to a second logic state, the switch electrically may couple the VIHBT voltage regulator 108 to the corresponding column of memory cells. In some embodiments, the columns that are electrically coupled to the VIHBT voltage regulator 108 include the unselected memory cells and the columns that are electrically decoupled from the VIHBT voltage regulator 108 include the selected memory cells (for reading or writing/programming).

The memory system 100 includes a word line decoder (WLD) 112. The WLD 112 can receive, through an address input, a word line address and provide, through an output, a word line signal to one of the word lines. The WLD 112 can receive, through a voltage reference input, the VWWL. The WLD 112 can provide a respective WL signal to each of the WL (e.g., WL[0] . . . WL[I−2], and WL[I−1] at least based on the address input. In some embodiments, the word line signal has a pulse shape, although any of other signal characteristics are within the scope of the disclosure. In some embodiments, the word line signal has a voltage equal or substantially equal to the VWWL voltage (e.g., within 10 mV), although any of other voltages are within the scope of the disclosure. In some embodiments, the WLD 112 is implemented as a digital circuit including logic gates such as complementary metal-oxide-semiconductor (CMOS) NAND gates and inverters, although any of other implementations are within the scope of the disclosure.

Figure 2:
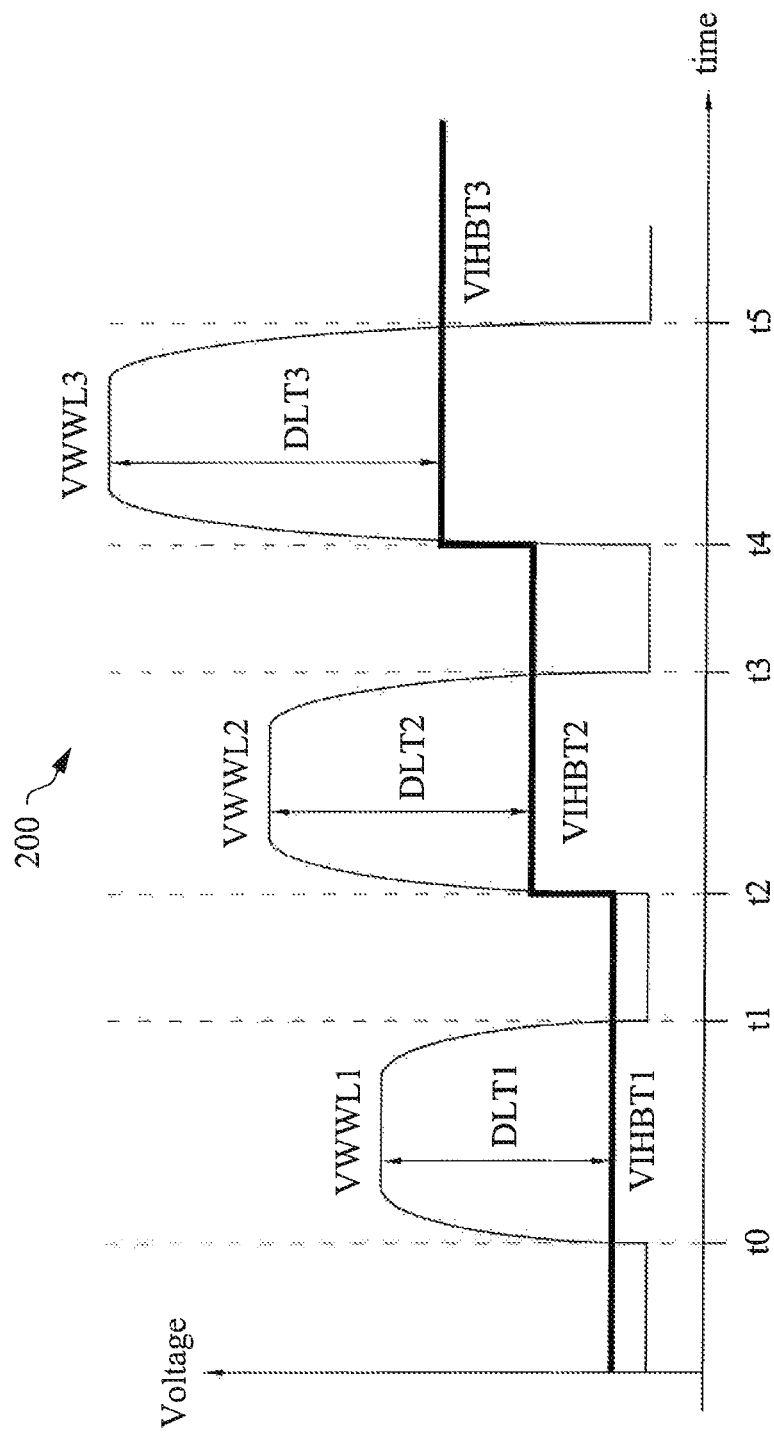
FIG. 2 illustrates a timing diagram of programming one or more memory cells, in accordance with some embodiments.

FIG. 2 illustrates a timing diagram 200 of programming one or more memory cells, in accordance with some embodiments. In some embodiments, at time t0, a row of memory cells receives, through a corresponding word line, a voltage VWWL1, and each of unselected ones of the row of memory cells receives, through a corresponding bit line, a voltage VIHBT1. In some embodiments, at time t1, the row of memory cells stops receiving the voltage VWWL1. DLT1 may be a delta between VWWL1 and VIHBT1.

In some embodiments, at time t2, a row of memory cells receives, through the corresponding word line, a voltage VWWL2, and each of unselected ones of the row of memory cells receives, through the corresponding bit line, the voltage VIHBT2. In some embodiments, at time t3, the row of memory cells stops receiving the voltage VWWL2. DLT2 may be a delta between VWWL2 and VIHBT2. In some embodiments, VIHBT2 is greater than VIHBT1. In some embodiments, VIHBT2 is greater than VIHBT1 by a same amount that VWWL2 is greater than VWWL1 such that DLT2 is equal to DLT1.

In some embodiments, at time t4, a row of memory cells receives, through the corresponding word line, a voltage VWWL3, and each of unselected ones of the row of memory cells receives, through the corresponding bit line, the voltage VIHBT3. In some embodiments, at time t5, the row of memory cells stops receiving the voltage VWWL3. DLT3 may be a delta between VWWL3 and VIHBT3. In some embodiments, VIHBT3 is greater than VIHBT2. In some embodiments, VIHBT3 is greater than VIHBT2 by a same amount that VWWL3 is greater than VWWL2 such that DLT3 is equal to DLT2.

In some embodiments, DLT1 is equal to DLT2 and DLT3, while in other embodiments, each inhibit voltage is proportional to, as shown in Eqn. (3), its corresponding word line voltage, although any of various deltas are within the scope of the present disclosure. In some embodiments, each delta is equal to a gate stress voltage (e.g., across a gate-source or gate-drain junction) of the select transistor of the corresponding memory cell receiving the word line voltage and the inhibit voltage.

Figure 3:
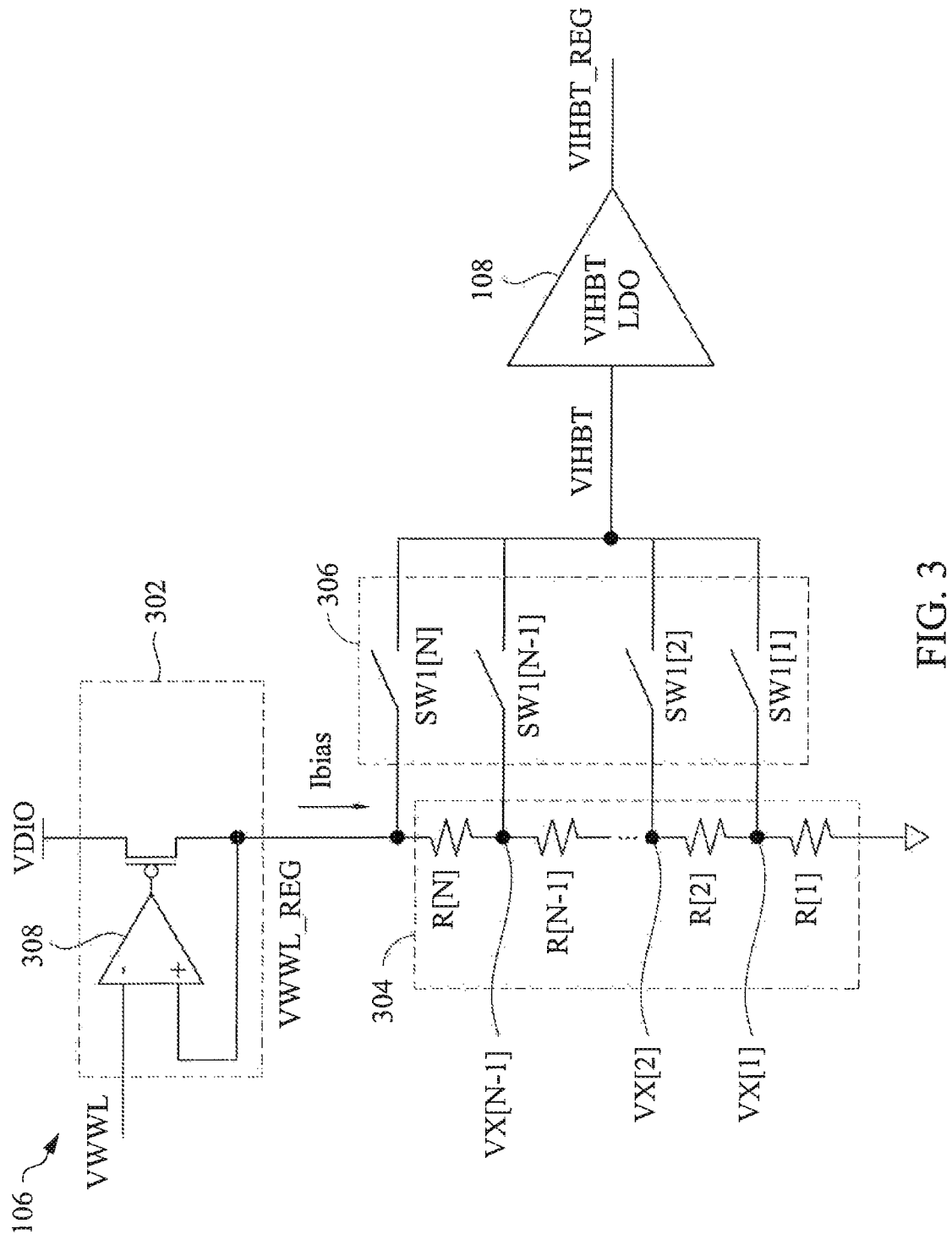
FIG. 3 illustrates a circuit diagram of the tracking circuit of FIG. 1, in accordance with some embodiments.

FIG. 3 illustrates a circuit diagram of the tracking circuit 106 of FIG. 1, in accordance with some embodiments. The tracking circuit 106 includes a voltage regulator 302. The voltage regulator 302 can receive, through an input terminal, a VWWL voltage and can provide, through an output terminal, a regulated VWWL (VWWL_REG) voltage. In some embodiments, such as in RRAM applications (e.g., the memory cell 102A1 is an RRAM memory cell), VWWL can be adjusted/vary (e.g., over time, e.g., by a memory controller). The voltage regulator 302 can receive, through a supply terminal, a reference voltage (e.g., VDIO). In some embodiments, the voltage regulator 302 includes the amplifier (e.g., an operational amplifier, a CMOS operational amplifier) 308 and a transistor (metal-oxide-semiconductor or MOS transistor, n-type MOS or NMOS transistor, p-type MOS or PMOS transistor) MWWL1 coupled to the amplifier 308. In some embodiments, a first input of the amplifier 308 receives VWWL from the input terminal of the voltage regulator 302 and an output of the amplifier 308 provides an amplified VWWL to a gate electrode of MWWL1. In some embodiments, a source electrode of MWWL1 receives VDIO and a drain electrode of MWWL1 provides VWWL_REG to the output terminal of the voltage regulator 302 and is coupled to a second input of the amplifier 308 such that the amplifier 308 is in a feedback (e.g., closed loop) configuration.

The tracking circuit 106 includes a resistor network 304 coupled to the voltage regulator 302. The resistor network 304 includes an input receiving VWWL_REG and a number of outputs, in which each output can provide a corresponding voltage from the voltages VX[1] to VX[N], wherein N is an integer number. The resistor network 304 includes a number of resistors, R[1]-R[N]. In some embodiments, the resistor R[N] has a first terminal coupled to the output terminal of the voltage regulator 302 and a second terminal, the resistor R[N−1] has a first terminal coupled to the second terminal of R[N] and a second terminal coupled to its adjacent resistor, the resistor R[1] has a first terminal coupled to the second terminal of its adjacent resistor and a second terminal, and the resistor R[0] has a first terminal coupled to the second terminal of its R[1] and a second terminal which can be coupled to a reference line/plane having a reference voltage (e.g., ground, a ground rail). Although FIG. 3 shows four resistors, the resistor network 304 can include any of a number of resistors. In some embodiments, the output coupled to the first terminal of R[N−1] provides the corresponding voltage VX[N−1], the output coupled to the first terminal of R[2] provides the corresponding voltage VX[2], the output coupled to the first terminal of R[1] provides the corresponding voltage VX[1]. In some embodiments, the input also includes a path that bypasses the resistor network 304 to provide VWWL_REG.

The tracking circuit 106 includes a switch network 306 coupled to the resistor network 304. The switch network 306 can include a number of inputs for receiving the voltages VX[1] to VX[N−1] and VWWL_REG, and the switch network 306 can include a number of outputs for providing VIHBT. The switch network 306 includes a number of switches SW1[1]-SW1[N]. Each of the switches of SW1[1]-SW1[N] can include an input terminal that receives a corresponding voltage from the resistor network 304 or the voltage regulator 302. For example, the input terminal of the SW1[N] receives VWWL_REG from the voltage regulator 302, the input terminal of the SW1[N−1] receives VX[N−1] from the first terminal of R[N−1] of the resistor network 304, the input terminal of the SW1[2] receives VX[2] from the first terminal of R[2] of the resistor network 304, and the input terminal of the SW1[1] receives VX[1] from the first terminal of R[1] of the resistor network 304.

Each of the switches of SW1[1]-SW1[N] can include an output for providing VIHBT to the VIHBT voltage regulator 108 in response to being electrically coupled to its corresponding input. Each of the switches of SW1[1]-SW1[N] can include a control terminal for receiving a control signal to electrically couple or decouple the input to the corresponding output. In some embodiments, responsive to receiving, at the control terminal, a first voltage corresponding to a first logic state, the switch electrically couples the input terminal (e.g., the voltage regulator 302 or the resistor network 304) to the output terminal to provide VIHBT to the VIHBT voltage regulator 108. VIHBT may be equal or substantially equal (e.g., within 10 mV) of the corresponding voltage received through the electrically coupled input terminal. In some embodiments, responsive to receiving, at the control terminal, a second voltage corresponding to a second logic state, the switch electrically decouples the input terminal from to the output terminal.

Figure 4:
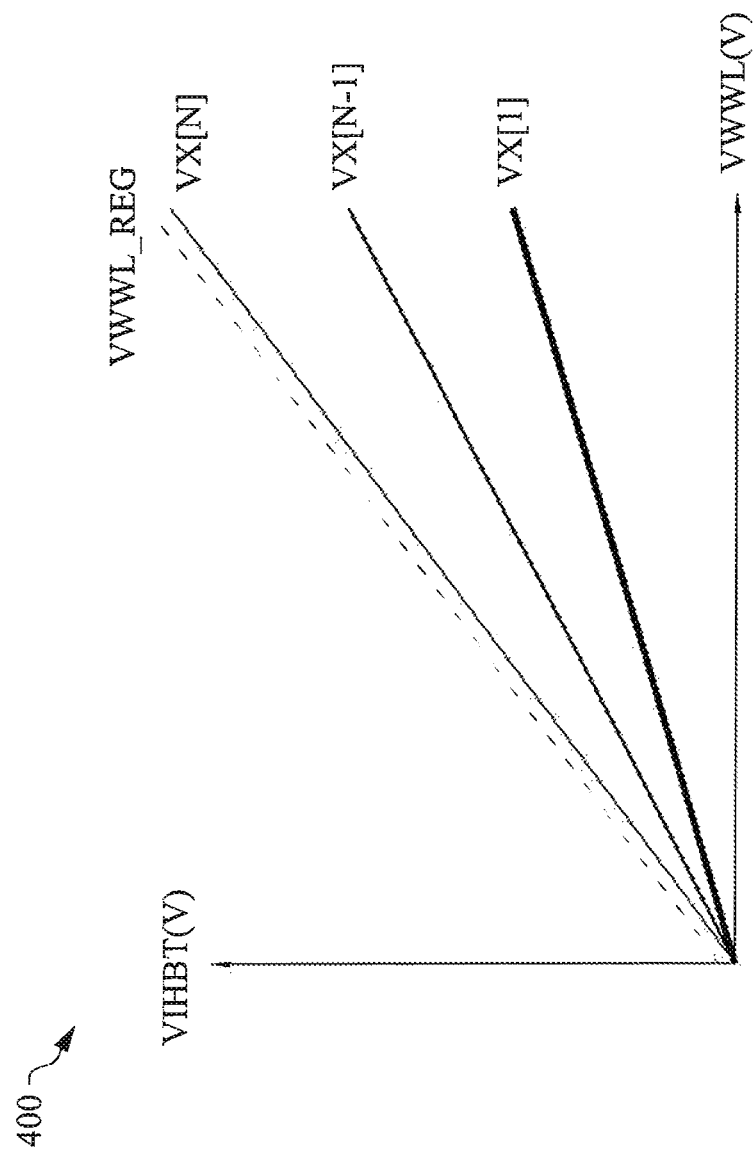
FIG. 4 illustrates a gain plot of the tracking circuit of FIG. 3, in accordance with some embodiments.

FIG. 4 illustrates a gain plot 400 of the tracking circuit 106 of FIG. 3, in accordance with some embodiments. FIG. 4 shows an input voltage-to-output voltage relationship of tracking circuit 106 as implemented in accordance with FIG. 3. FIG. 4 illustrates that the input voltage is proportional to the output voltage. Each curve represents a different input-output relationship based on how the switch network 306 is configured (e.g., whether VWWL_REG, VX[N], VX[N−1], or VX[1] is selected). The x-axis represents voltage values of VWWL (the input voltage) and the y-axis represents voltage values of VIHBT (the output voltage). The curve labeled VWWL_REG represents the voltage of VWWL_REG versus the voltage of VWWL. The curve labeled VX[N] represents the voltage of VX[N] versus the voltage of VWWL. The curve labeled VX[N−1] represents the voltage of VX[N−1] versus the voltage of VWWL. The curve labeled VX[1] represents the voltage of VX[1] versus the voltage of VWWL. In some embodiments, the input voltage is proportional to the output voltage irrespective of how the switch network 306 is configured.

Figure 5:
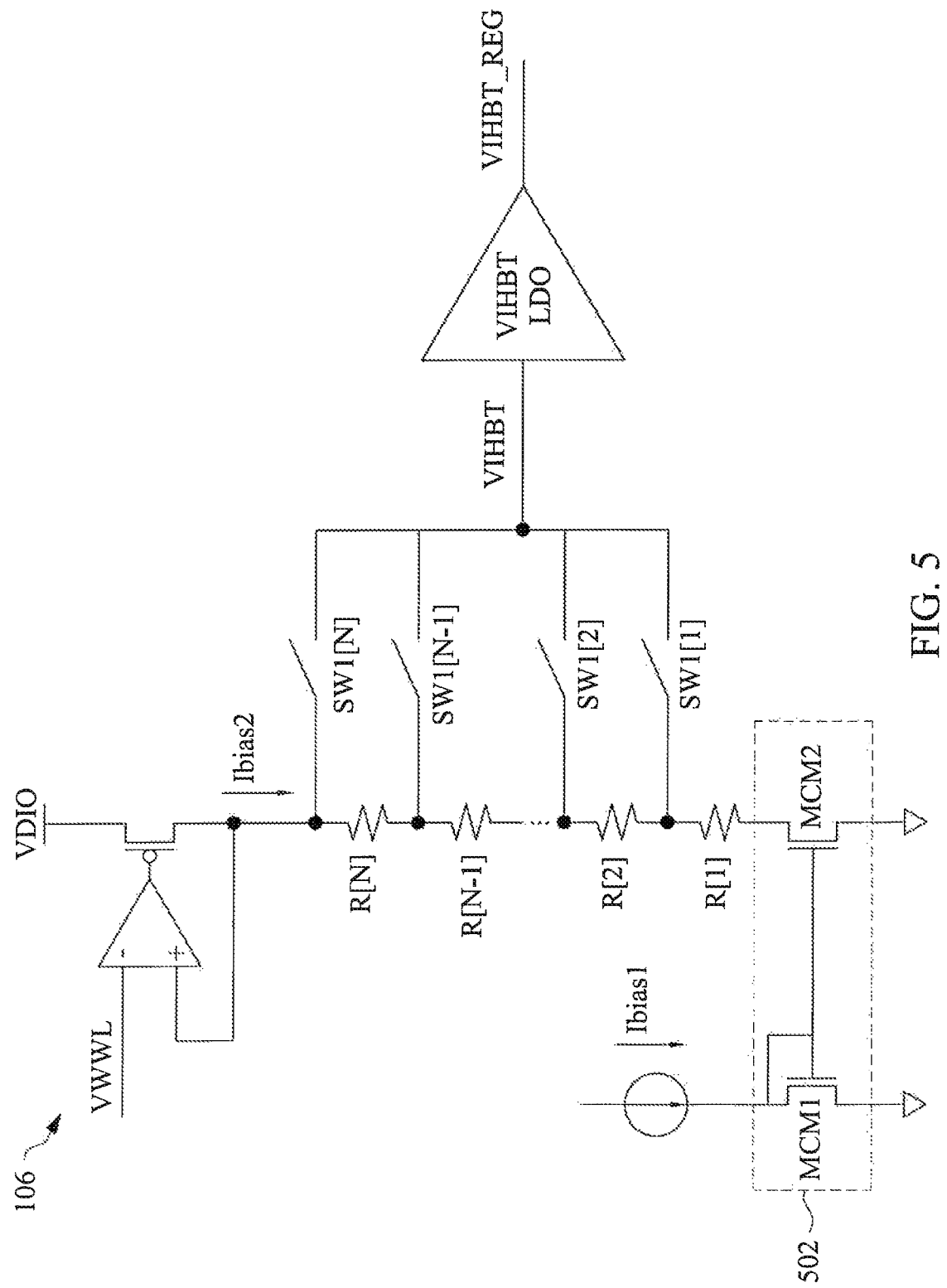
FIG. 5 illustrates another circuit diagram of the tracking circuit of FIG. 1, in accordance with some embodiments.

FIG. 5 illustrates another circuit diagram of the tracking circuit 106 of FIG. 1, in accordance with some embodiments. In some embodiments, the circuit diagram of the tracking circuit 106 in FIG. 5 is similar to the circuit diagram of the tracking circuit 106 in FIG. 3 except for the differences described herein. At a high level, the circuit difference is that the resistor network 304 of the tracking circuit 106 in FIG. 5 is coupled to an output of a current mirror (CM) 502, whereas the resistor network 304 of the tracking circuit 106 in FIG. 3 is coupled to ground. The tracking circuit 106 in FIG. 5 is operationally different from the tracking circuit 106 in FIG. 3 in that the tracking circuit 106 in FIG. 5 is current-driven, whereas the tracking circuit 106 in FIG. 3 is voltage-driven. As a result, the VIHBT voltage of the tracking circuit 106 in FIG. 5 is at a fixed delta from the VWWL voltage of the tracking circuit 106 in FIG. 5, whereas the VIHBT voltage of the tracking circuit 106 in FIG. 3 is proportional to the VWWL voltage of the tracking circuit 106 in FIG. 5. These relationships between VIHBT and VWWL are further illustrated in the graphs of FIGS. 4 and 6.

In some embodiments, the CM 502 has an input terminal that receives (e.g., sinks) a bias current (Ibias1) from a current source, an output terminal that provides another bias current (Ibias2) to the resistor network 304 and the voltage regulator 302 (e.g., sinks from the resistor network 304 and the voltage regulator 302), and a rail terminal to receive a rail/reference voltage (e.g., ground, 0 V, VSS). In some embodiments, the bias current Ibias2 is proportional (e.g., equal or substantially equal to) to the bias current Ibias1. The CM 502 can include a transistor (e.g., MOS, NMOS, PMOS) MCM1 that has a drain electrode to receive Ibias1, a source electrode coupled to a reference line (e.g., ground), and a gate electrode coupled to the drain electrode. The CM 502 can include another transistor MCM2 that has a gate electrode coupled to the gate electrode of MCM1, a drain electrode to provide Ibias2, and a source electrode coupled to the reference line. In some embodiments, the CM 502 is a trimmable CM.

Figure 6:
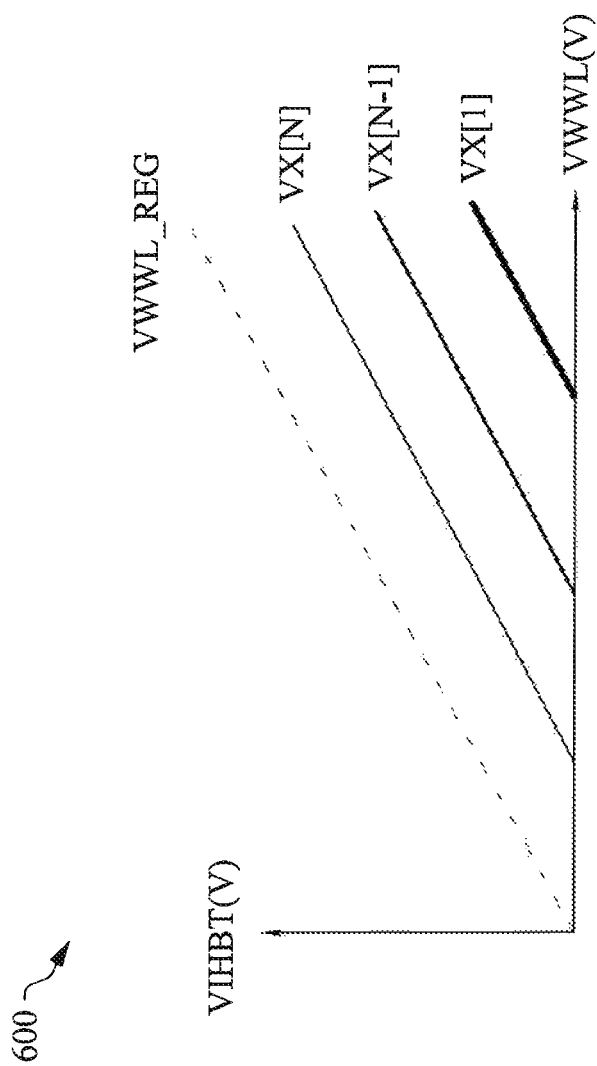
FIG. 6 illustrates a gain plot of the tracking circuit of FIG. 5, in accordance with some embodiments.

FIG. 6 illustrates a gain plot 600 of the tracking circuit 106 of FIG. 5, in accordance with some embodiments. FIG. 6 shows an input voltage-to-output voltage relationship of tracking circuit 106 as implemented in accordance with FIG. 5. In some embodiments, the gain plot 600 is similar to the gain plot 400 except that FIG. 6 illustrates that the input voltage is at a fixed delta from the output voltage (e.g., as long as the output voltage is greater than 0V). In some embodiments, the input voltage is at a fixed delta from the output voltage irrespective of how the switch network 306 is configured.

Figure 7:
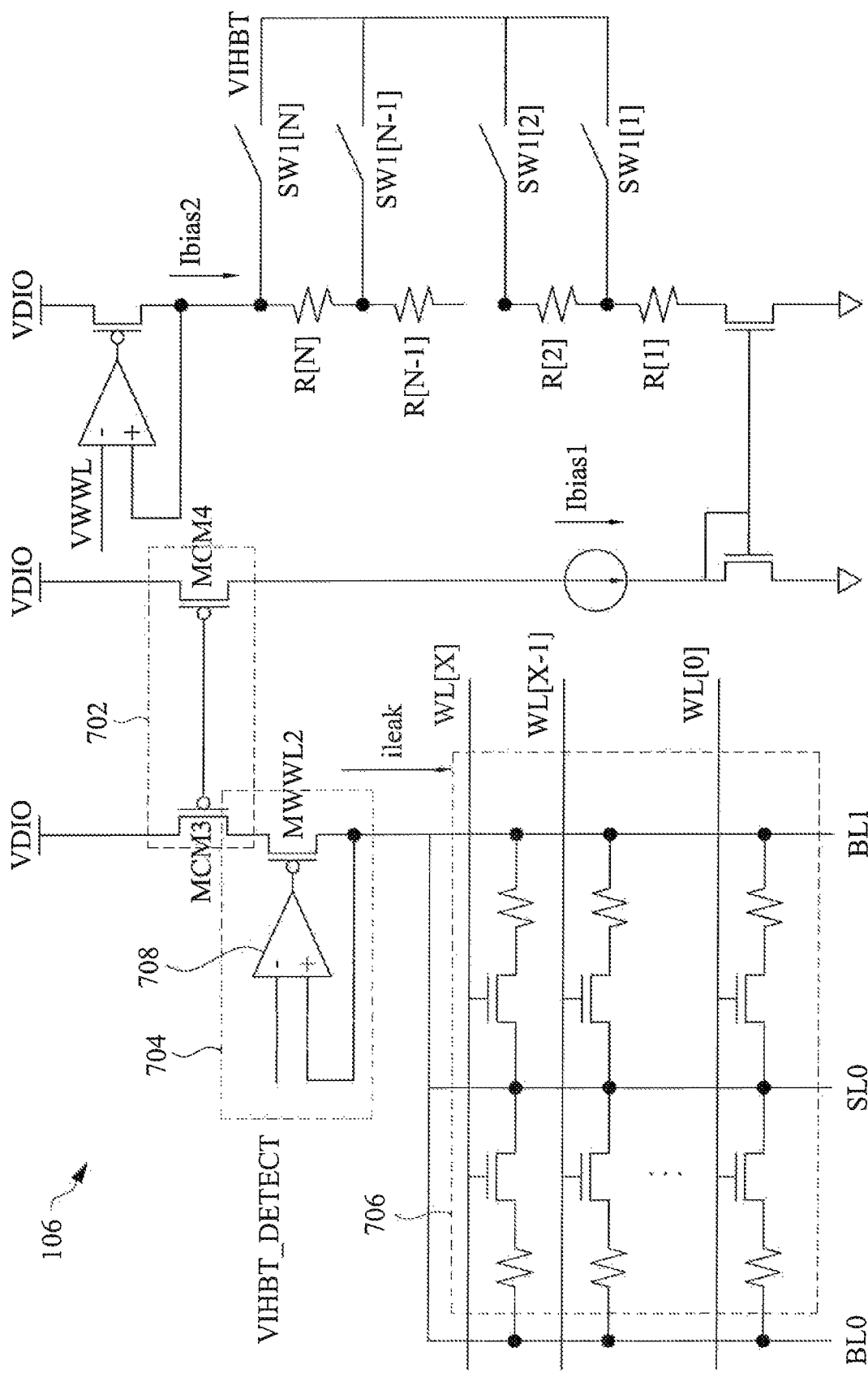
FIG. 7 illustrates yet another circuit diagram of the tracking circuit of FIG. 1, in accordance with some embodiments.

FIG. 7 illustrates yet another circuit diagram of the tracking circuit 106 of FIG. 1, in accordance with some embodiments. In some embodiments, the circuit diagram of the tracking circuit 106 in FIG. 7 is similar to the circuit diagram of the tracking circuit 106 in FIG. 5 except for the differences described herein. At a high level, the circuit difference is that the CM 502 is coupled to a reference memory array 706 (via the current mirror (CM) 702). The tracking circuit 106 in FIG. 7 is operationally different from the tracking circuit 106 in FIG. 5 in that the tracking circuit 106 in FIG. 7 is driven by process, voltage supply voltage, and temperature (PVT)-compensated current (ileak), whereas the tracking circuit 106 in FIG. 5 is driven by an uncompensated current (Ibias1). Therefore, the VIHBT voltage of the tracking circuit 106 in FIG. 7 compensates for PVT-induced change in leakage, whereas the VIHBT voltage of the tracking circuit 106 in FIG. 5 does not compensates for PVT-induced change in leakage.

The CM 702 can include an input terminal for receiving a leakage current (ileak), an output terminal for receiving Ibias1, and a rail terminal for receiving a rail/reference voltage (e.g., VDIO). The CM 702 can include transistors MCM3 and MCM4. In some embodiments, the CM 702 is similar to the CM 502. In some embodiments, the CM 702 has transistors of an opposite type than the transistors of the CM 502 (e.g., the CM 702 includes PMOS transistors and the CM 502 includes NMOS transistors).

In some embodiments, the tracking circuit 106 includes a reference memory array 706. The reference memory array 706 can include a number of memory cells similar to the memory cell 102A1. In some embodiments, the reference memory array 706 is an unselected column of memory cells from the memory array 102. In some embodiments, the reference memory array 706 is separate from the memory array 102. That is, the reference memory array 706 can be dedicated to operation of the tracking circuit 106. In some embodiments, each of the memory cells in the reference memory array 706 receive an inhibit voltage through its respective BLs and SL (e.g., BL0, SL0, and SL1) and 0 V through its respective WLs (e.g., one of WL[0] to WL[X]). In some embodiments, the BLs and SLs are shared/coupled together as a common bit line. In some embodiments, the memory cells generate ileak and provide ileak through the common bit line to the input of the CM 702.

In some embodiments, the memory cells of the reference memory array 706 include RRAM memory cells. In such embodiments, the memory array 102 can include RRAM memory cells and VWWL can vary or be adjusted. In other embodiments, the memory cells of the reference memory array 706 can be non-RRAM memory cells such as NAND flash memory cells, NOR flash memory cells, SRAM memory cells, MRAM memory cells, PCM memory cells, FeRAM memory cells, and other types of memory cores that are suitable for use within the memory array. In such embodiments, the memory array 102 can include non-RRAM memory cells and VWWL can be fixed.

In some embodiments, the tracking circuit 106 includes a voltage regulator 704 that is coupled in between the reference memory array 706 and the CM 702. In some embodiments, the voltage regulator includes an input terminal for receiving a VIHBT DETECT voltage, an output terminal for providing a regulated VIHBT DETECT voltage to the reference memory array 706, and a supply terminal coupled to the input terminal of the CM 702. In some embodiments, the regulated VIHBT DETECT is provided to the memory cells through the common bit line.

In some embodiments, the voltage regulator 704 includes an amplifier 708 and a transistor MWWL2. In some embodiments, the voltage regulator 704 is similar to the voltage regulators 108 and 308. The source electrode of MWWL2 can be coupled to the input terminal of the CM 702 and the drain electrode of MWWL2 can be coupled to the common bit line of the reference memory array 706. In some embodiments, MWWL2 electrically couples the common bit line to the CM 702 to provide ileak to the CM 702 and from the reference memory array 706.

The ileak current can be at least based on process, voltage supply voltage, and temperature (PVT) parameters. For example, at a low temperature (e.g., −40 C) and with transistors fabricated in a slow process corner (e.g., 10% or 20% higher transistor threshold voltage), a leakage current is lower than a leakage current at a nominal temperature (e.g., 25 C) and with transistors fabricated in a nominal process corner, and at a high temperature (e.g., 85 C or 115 C) and with transistors fabricated in a fast process corner (e.g., 10% or 20% lower transistor threshold voltage), a leakage current is higher than the leakage current at the nominal temperature and with transistors fabricated in the nominal process corner. Any of other temperatures and process corners are within the scope of the present disclosure. As shown in the tracking circuit 106 of the FIG. 7, a higher leakage current corresponds to a higher Ibias1, which corresponds to a higher Ibias2, which corresponds to a lower VIHBT. Likewise, as shown in the tracking circuit 106 of the FIG. 7, a lower leakage current corresponds to a lower Ibias1, which corresponds to a lower Ibias2, which corresponds to a higher VIHBT. Thus, in some embodiments, the tracking circuit 106 of the FIG. 7 adjusts (e.g., compensates) VIHBT at least based on PVT parameters.

Figure 8:
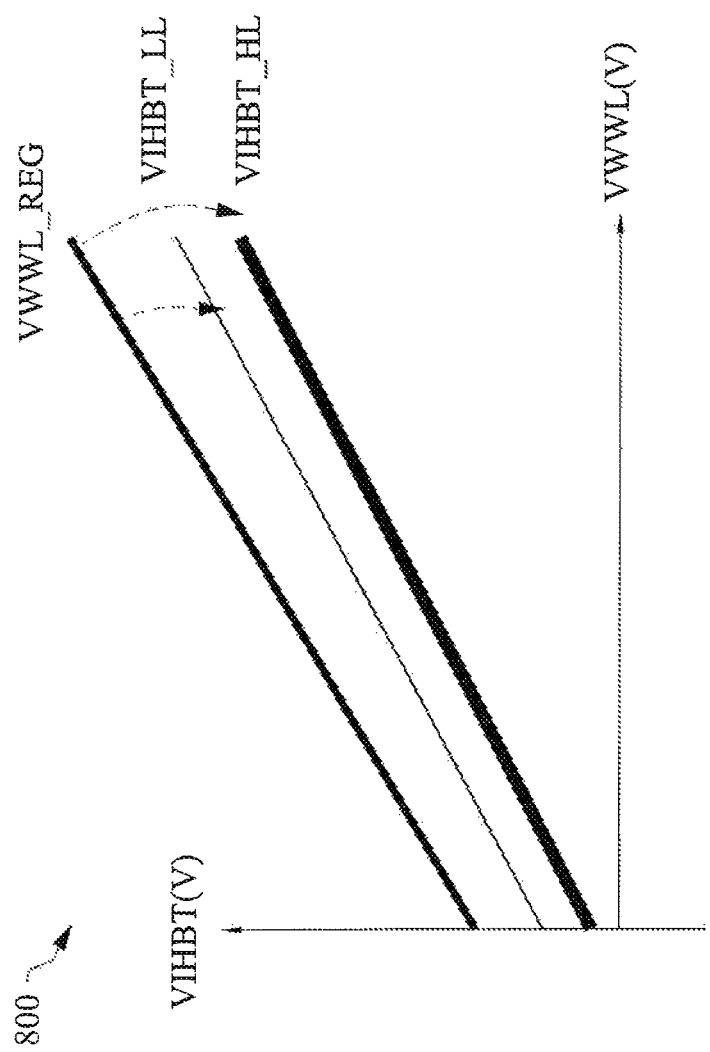
FIG. 8 illustrates a gain plot of the tracking circuit of FIG. 7, in accordance with some embodiments.

FIG. 8 illustrates a gain plot 800 of the tracking circuit 106 of FIG. 7, in accordance with some embodiments. FIG. 8 shows an input voltage-to-output voltage relationship of tracking circuit 106 as implemented in accordance with FIG. 7. In some embodiments, the gain plot 800 is similar to the gain plot 600 except that FIG. 8 illustrates that the delta changes as at least one of the PVT parameters changes. In some embodiments, a curve labeled VIHBT_LL represents VIHBT with a low ileak, e.g., at cold temperature and with the transistors fabricated in the slow process corner as described with respect to FIG. 7. In some embodiments, a curve labeled VIHBT_HL represents VIHBT with a high ileak, e.g., at hot temperature and with the transistors fabricated in the fast process corner as described with respect to FIG. 7. In some embodiments, the delta between the input voltage (VWWL) and the output voltage (VIHBT) changes based on the PVT parameters.

Figure 9:
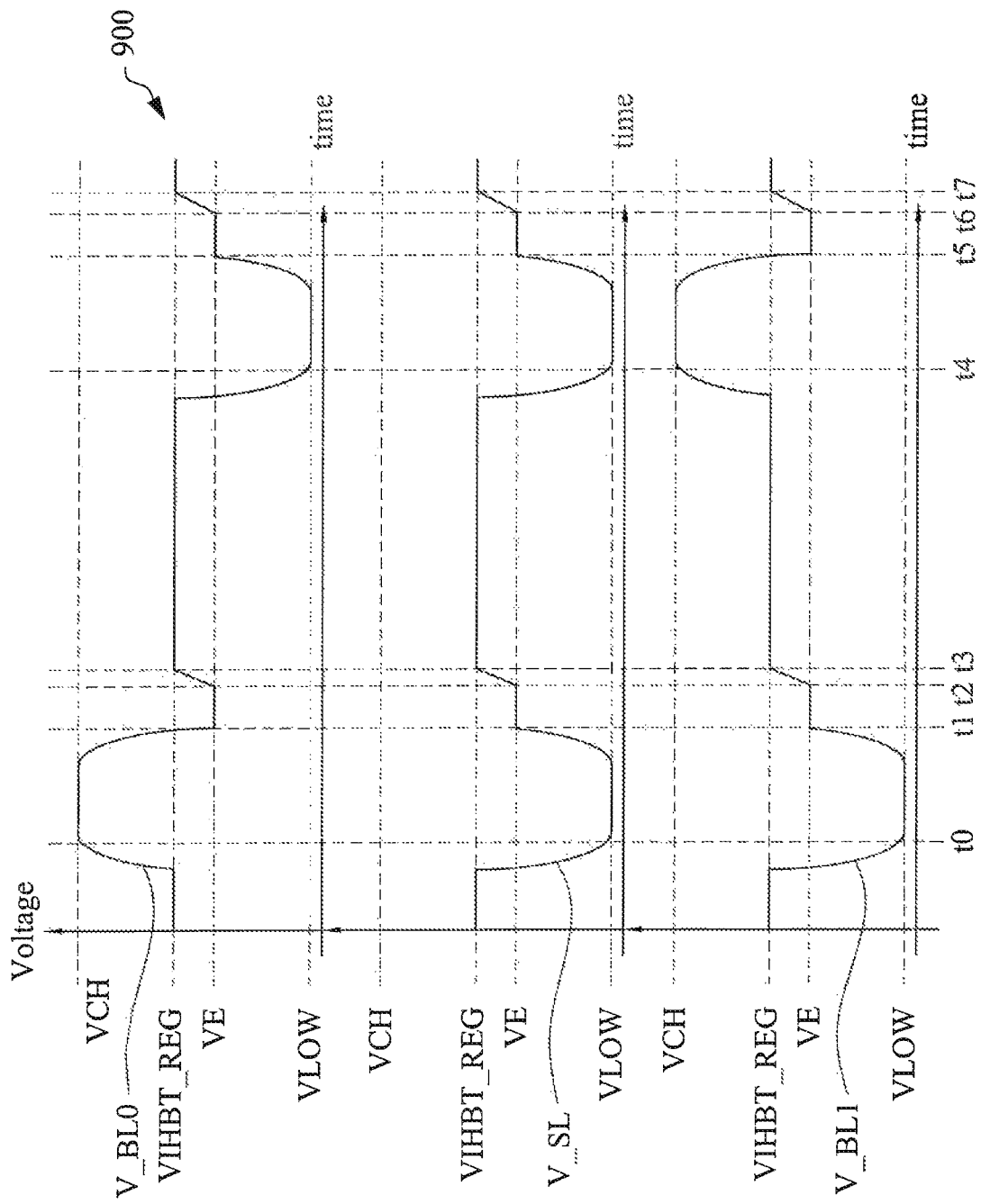
FIG. 9 illustrates a timing diagram of programming one or more memory cells, in accordance with some embodiments.

FIG. 9 illustrates a timing diagram 900 of programming one or more memory cells, in accordance with some embodiments. In some embodiments, a selected column of memory cells receives, through a corresponding first bit line (e.g., BL[0]), select line (e.g., SL[0]), and second bit line (e.g., BL[1]), signals V_BL0, V_SL, and V_BL1, respectively. In some embodiments, at time t0, V_BL0 has a voltage of VCH (e.g., a voltage for programming a memory cell) V_SL has a voltage of VLOW, and V_BL1 has a voltage of VLOW. In some embodiments, starting at t0, a selected memory cell (e.g., coupled to the first bit line, the select line, and a word line for receiving a word line voltage to enable the select transistor) can be programmed.

In some embodiments, at time t1, V_BL0, V_SL, and VLOW each have a voltage of VE (equalizer voltage). In some embodiments, VE is proportional to VCH. For example, VE can be equal to one-third of VCH, although any of other ratios or values of VE and VCH are within the scope of the present disclosure. In some embodiments, a resistor network (such as the resistor network 304 in FIG. 3) can ensure that VE is proportional to VCH by receiving VCH as an input and providing VE as an output. In some embodiments, the selected memory cell can be programmed between times t0 and t1. In some embodiments, at time t2, the first bit line, select line, and second bit line charge to VIHBT_REG. In some embodiments, at time t3, the first bit line, select line, and second bit line finish charging to VIHBT_REG. That is, in some embodiments, at time t3, V_BL0, V_SL, and VLOW each have a voltage of VIHBT_REG. In some embodiments, starting at time t3, the first bit line, select line, and second bit line are in standby. Advantageously, setting a voltage of V_BL0, V_SL, and VLOW to VE at time t1 can reduce a time period (e.g., t2 to t3) for charging the first bit line, select line, and second bit line to VIHBT_REG and can reduce power consumption associated with charging.

The following table illustrates an example of voltages received by bit and select lines at times t0-t3.

|  | Write (t0-t1) | End of write (t1-t2) | Standby (t3 and after) |
|---|---|---|---|
| BL[0] | VCH | VE | VIHBT_REG |
| SL[0] | VLOW | VE | VIHBT_REG |
| BL[1] | VLOW | VE | VIHBT_REG |

In some embodiments, VCH is equal to 1 V, VIHBT_REG is equal to 0.5 V, VLOW is equal to 0 V, VE is equal to 0.33 V, and VWWL is equal to 1.8 V, although any of other voltages are within the scope of the disclosure.

In some embodiments, events at times t4-t7 are similar to t0-t3 except that the selected memory cell coupled to the select line and the second bit line can be programmed. For example, at time t4, V_BL0 has a voltage of VLOW, V_SL has a voltage of VLOW, and V_BL1 has a voltage of VCH; at time t5, V_BL0, V_SL, and VLOW each have a voltage of VE; at time t6, the bit and select lines charge to VIHBT_REG; and at time t7, V_BL0, V_SL, and VLOW each have a voltage of VIHBT_REG.

Figure 10:
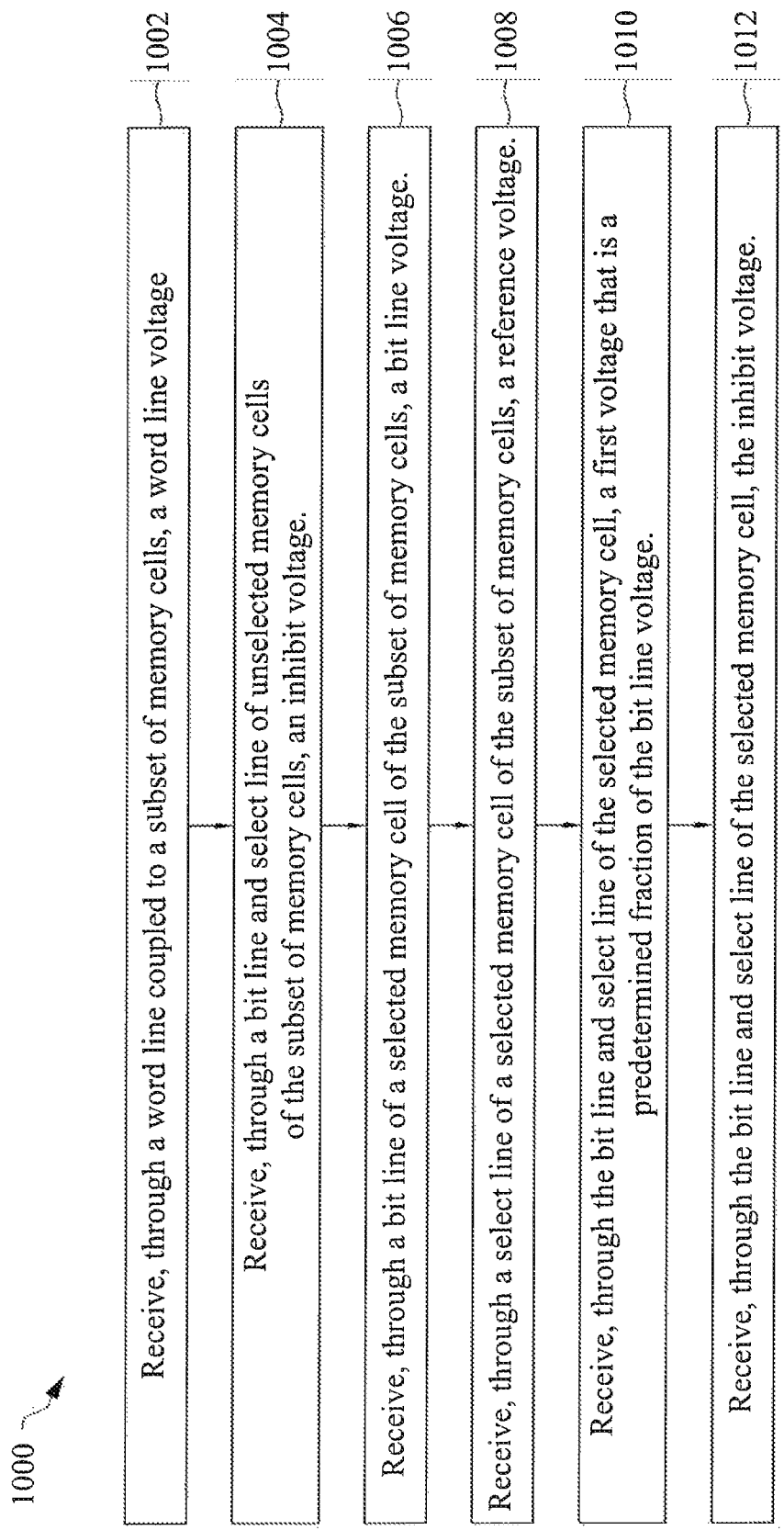
FIG. 10 illustrates a flowchart of a method to operate a memory device, in accordance with some embodiments of the present disclosure.

FIG. 10 illustrates a flowchart of a method 1000 to operate a memory device, in accordance with some embodiments of the present disclosure. It is noted that the method 1000 is merely an example and is not intended to limit the present disclosure. Accordingly, it is understood that additional operations may be provided before, during, and after the method 1000 of FIG. 10, and that some other operations may only be briefly described herein. In some embodiments, the method 1000 is performed by a memory array (e.g., the memory array 102). In some embodiments, operations of the method 1000 may be associated with the memory device of FIGS. 1-9.

The method 1000 starts with operation 1002 of receiving, through a word line (e.g., WL[0]) coupled to a subset of memory cells (e.g., 102A), a word line voltage (e.g., VWWL). The method 1000 continues to operation 1004 of receiving, through a bit line (e.g., BL[J−2]) and select line (e.g., SL[J/2−1]) of unselected memory cells of the subset of memory cells (e.g., 102D), an inhibit voltage (e.g., VIHBIT_REG). In some embodiments, a voltage delta between the word line voltage VWWL and the inhibit voltage VIHBIT_REG is fixed, while in other embodiments, the inhibit voltage VIHBIT_REG is proportional to the word line voltage VWWL. In some embodiments, the voltage delta is maintained by a tracking circuit (e.g., the tracking circuit 106) coupled to the memory array 102.

The method 1000 continues to operation 1006 of receiving, through a bit line (e.g., BL[0]) of selected memory cells (e.g., 102A1) of the subset of memory cells 102A, a bit line voltage (e.g., V_BL1), e.g., for programming/writing the selected memory cells of the subset of memory cells. The method 1000 continues to operation 1008 of receiving, through a select line (e.g., SL[0]) of selected memory cells 102A1 of the subset of memory cells 102A, a reference voltage (e.g., V_SL), e.g., for programming the selected memory cells of the subset of memory cells. The method 1000 continues to operation 1010 of receiving, through the bit line and select line of the selected memory cell, a first voltage (e.g., VE) that is a predetermined fraction of the bit line voltage. In some embodiments, the first voltage VE is for equalizing the voltages of the bit line and select line. The method 1000 continues to operation 1012 of receiving, through the bit line and select line of the selected memory cell, an inhibit voltage (e.g., VIHBIT_REG), e.g., for keeping the selected memory cells of the subset of memory cells in standby for a next write.

In some embodiments, a memory cell (e.g., 102A1) of the memory array 102 can be read, e.g., by a memory controller. For example, the memory controller applies a programming signal/voltage on the word line WL, the memory controller applies a reference signal on the select line, and the memory controller senses a signal/voltage on the bit line BL. In response to sensing a first signal on the bit line BL, the memory controller can determine that the memory cell is in a first state (e.g., the resistor R0 is in a first state), and in response to sensing a second signal on the bit line BL, the memory controller can determine that the memory cell is in a second state (e.g., the resistor R0 is in a second state).

Figure 11:
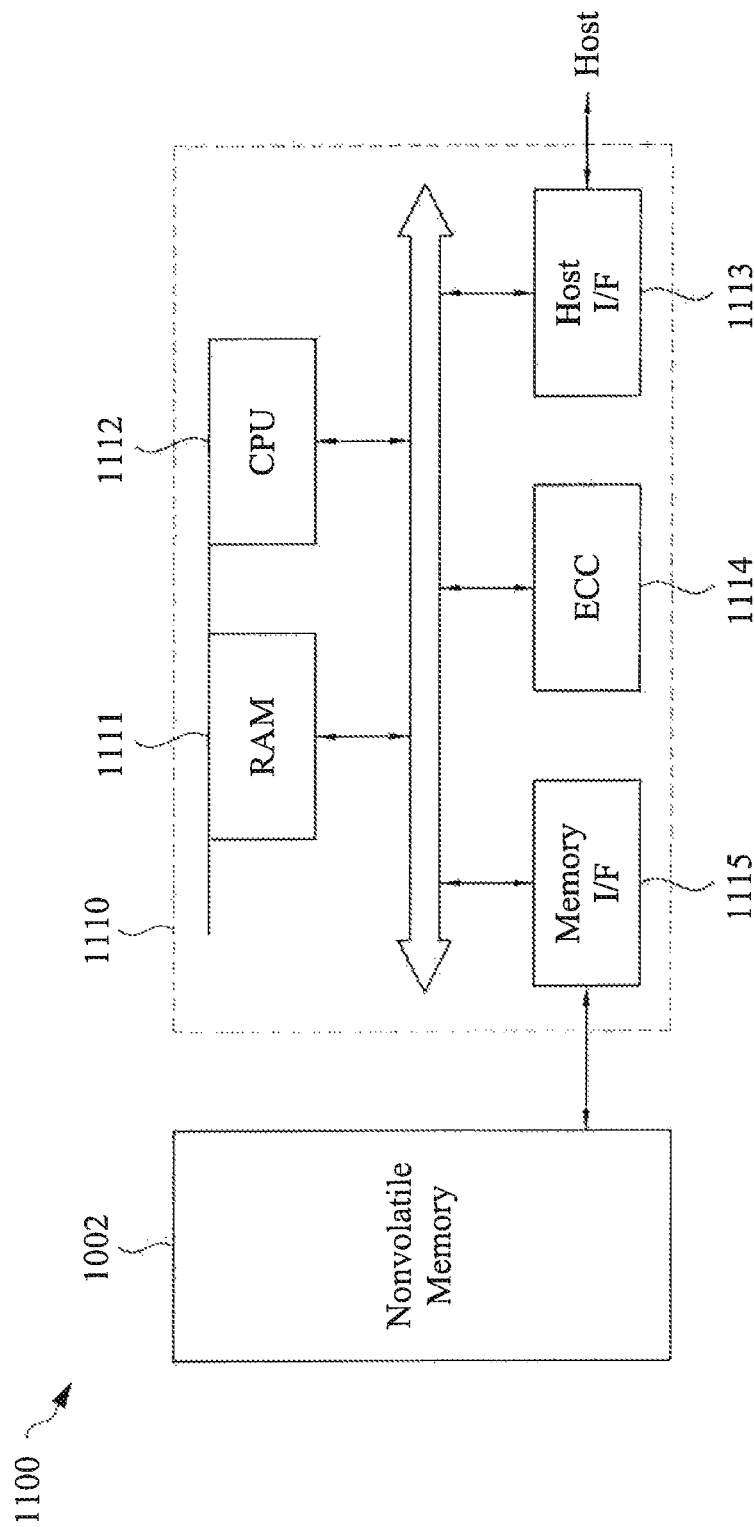
FIG. 11 is a block diagram showing the configuration of a memory system, according to various embodiment of the present disclosure.

FIG. 11 is a block diagram showing the configuration of a memory system, according to various embodiment of the present disclosure. As shown, a memory system 1100 according to various embodiments of the present disclosure includes a non-volatile memory device 1120 and a memory controller 1110.

The non-volatile memory device 1120 may include the 3D memory device, as disclosed herein. In addition, the non-volatile memory device 1120 may be a multi-chip package composed of a number of ferroelectric memory chips.

The memory controller 1110 is configured to control the non-volatile memory device 1120. The memory controller 1110 may include RAM 1111, a central processing unit (CPU) 1112, a host interface (I/F) 1113, an error-correcting code (ECC) 1114, and a memory interface 1115. The memory controller 1110 may include the memory system 100 described herein. The RAM 1111 functions as an operation memory of the CPU 1112. The RAM 1111 may include the memory array 102 described herein. The CPU 1112 performs the general control operation for data exchange of the memory controller 1110. The host interface 1113 includes a data exchange protocol of a host being coupled to the memory system 1100. In addition, the ECC 1114 may detect and correct errors included in a data read from the non-volatile memory device 1120. The memory interface 1115 interfaces with the non-volatile memory device 1120. The memory controller 1110 may further store code data to interface with the host.

In some aspects of the present disclosure, a memory device is disclosed. In some aspects, the memory device includes a first voltage regulator to receive a word line voltage provided to a memory array; a resistor network coupled to the first voltage regulator to provide an inhibit voltage to the memory array, wherein the resistor network comprises a plurality of resistors and wherein each of the resistors are coupled in series to an adjacent one of the plurality of resistors; and a switch network comprising a plurality of switches, wherein each of the switches are coupled to a corresponding one of the plurality of resistors and to the memory array via a second voltage regulator.

In some aspects, the resistor network is coupled to ground. In some aspects, the resistor network is coupled to a current mirror to receive a bias current. In some aspects, the current mirror is coupled to a plurality of memory cells and the bias current is at least based on a leakage current of the plurality of memory cells. In some aspects, a third voltage regulator is coupled between the current mirror and the plurality of memory cells and the third voltage regulator biases at least a bit line and select line of the plurality of memory cells.

In some aspects, the plurality of memory cells is an unselected portion of the memory array. In some aspects, the plurality of memory cells is separate from the memory array. In some aspects, the inhibit voltage is less than the word line voltage by a fixed delta. In some aspects, the inhibit voltage is proportional to the word line voltage.

In some aspects of the present disclosure, a memory system is disclosed. In some aspects, the memory system includes a memory array; a tracking circuit to receive a word line voltage provided to the memory array and to provide an inhibit voltage to bias a plurality of unselected memory cells of the memory array; and a voltage regulator to receive the inhibit voltage and to provide a filtered inhibit voltage to the plurality of unselected memory cells.

In some aspects, the memory system further includes a plurality of switches, wherein each of the switches is coupled to the voltage regulator and a corresponding subset of memory cells. In some aspects, the plurality of unselected memory cells includes each of the subsets of memory cells that are electrically coupled to the voltage regulator via the corresponding one of the plurality of switches. In some aspects, the tracking circuit includes a mapping structure that maps the word line voltage to the inhibit voltage.

In some aspects, the tracking circuit includes: a second voltage regulator to receive the word line voltage; a resistor network coupled to a second voltage regulator to provide the inhibit voltage, wherein the resistor network comprising a plurality of resistors and wherein each of the resistors are coupled in series to an adjacent one of the plurality of resistors; and a switch network comprising a plurality of second switches, wherein each of the second switches is coupled to a corresponding one of the plurality of resistors and to the voltage regulator.

In some aspects, the resistor network is coupled to ground. In some aspects, the resistor network is coupled to a current mirror to receive a bias current. In some aspects, the current mirror is coupled to a plurality of second memory cells and the bias current is at least based on a leakage current of the plurality of second memory cells.

In some aspects of the present disclosure, a method is disclosed. In some aspects, the method for operating a memory device, the method includes receiving, through a word line coupled to a subset of memory cells, a word line voltage; and receiving, through a bit line and select line of unselected memory cells of the subset of memory cells, an inhibit voltage that is a fixed delta offset from the word line voltage.

In some aspects, the method includes receiving, at a first time and through a bit line of a selected memory cell of the subset of memory cells, a bit line voltage; receiving, at the first time and through a select line of a selected memory cell of the subset of memory cells, a reference voltage; and receiving, at a second time and through the bit line and select line of the selected memory cell, a first voltage that is a predetermined fraction of the bit line voltage. In some aspects, the method includes receiving, at a third time and through the bit line and select line of the selected memory cell, the inhibit voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a first voltage regulator to receive a word line voltage provided to a memory array;
   a resistor network coupled to the first voltage regulator to provide an inhibit voltage to the memory array, wherein the resistor network comprises a plurality of resistors and wherein each of the resistors are coupled in series to an adjacent one of the plurality of resistors; and
   a switch network comprising a plurality of switches, wherein each of the switches are coupled to a corresponding one of the plurality of resistors and to the memory array via a second voltage regulator.

2. The memory device of claim 1, wherein the resistor network is coupled to ground.

3. The memory device of claim 1, wherein the resistor network is coupled to a current mirror to receive a bias current.

4. The memory device of claim 3, wherein the current mirror is coupled to a plurality of memory cells and the bias current is at least based on a leakage current of the plurality of memory cells.

5. The memory device of claim 4, wherein a third voltage regulator is coupled between the current mirror and the plurality of memory cells and the third voltage regulator biases at least a bit line and select line of the plurality of memory cells.

6. The memory device of claim 4, wherein the plurality of memory cells is an unselected portion of the memory array.

7. The memory device of claim 4, wherein the plurality of memory cells is separate from the memory array.

8. The memory device of claim 1, wherein the inhibit voltage is less than the word line voltage by a fixed delta.

9. The memory device of claim 1, wherein the inhibit voltage is proportional to the word line voltage.

* * * * *